US010644063B2

(12) United States Patent
Wang et al.

(10) Patent No.: US 10,644,063 B2
(45) Date of Patent: May 5, 2020

(54) TRANSISTOR ARRAY AND MANUFACTURING METHOD THEREOF

(71) Applicant: Beijing Institute of Nanoenergy and Nanosystems, Beijing (CN)

(72) Inventors: Zhonglin Wang, Beijing (CN); Wenzhuo Wu, Beijing (CN); Xiaonan Wen, Beijing (CN)

(73) Assignee: Beijing Institute of Nanoenergy and Nanosystems, Beijing (CN)

( * ) Notice: Subject to any disclaimer, the term of this patent is extended or adjusted under 35 U.S.C. 154(b) by 107 days.

(21) Appl. No.: 14/759,843

(22) PCT Filed: Dec. 12, 2013

(86) PCT No.: PCT/CN2013/089184
§ 371 (c)(1),
(2) Date: Jul. 8, 2015

(87) PCT Pub. No.: WO2014/108012
PCT Pub. Date: Jul. 17, 2014

(65) Prior Publication Data
US 2015/0357374 A1 Dec. 10, 2015

(30) Foreign Application Priority Data

Jan. 11, 2013 (CN) .......................... 2013 1 0011220

(51) Int. Cl.
*H01L 27/20* (2006.01)
*G01L 9/08* (2006.01)
(Continued)

(52) U.S. Cl.
CPC ................ *H01L 27/20* (2013.01); *G01L 1/16* (2013.01); *G01L 9/08* (2013.01); *H01L 29/78* (2013.01);
(Continued)

(58) Field of Classification Search
CPC .......................... H01L 29/0676; H01L 29/413
See application file for complete search history.

(56) References Cited

U.S. PATENT DOCUMENTS 3,801,838 A * 4/1974 Kistler ..................... G01L 9/008
310/338
5,760,530 A * 6/1998 Kolesar .................... H01L 27/20
310/317

(Continued)

FOREIGN PATENT DOCUMENTS

CN 102484200 5/2012
CN 102645294 8/2012

OTHER PUBLICATIONS

Piezoelectric Field Effect Transistor and Nanoforce Sensor Based on a Single ZnO Nanowire Xudong Wang, Jun Zhou, Jinhui Song, Jin Liu, Ningsheng Xu, and Zhong L. Wang, Nano Letters 2006 6 (12), 2768-2772.*

(Continued)

*Primary Examiner* — Matthew L Reames
*Assistant Examiner* — John A Bodnar
(74) *Attorney, Agent, or Firm* — Cesari and McKenna, LLP

(57) ABSTRACT

The disclosure provides a transistor array including a substrate and a plurality of transistor elements sharing the substrate. Each of the transistor elements includes: a bottom electrode disposed on the substrate and a connection wire for the bottom electrode; a piezoelectric body disposed on the bottom electrode, wherein the piezoelectric body is made of piezoelectric material; and a top electrode disposed on the piezoelectric body. The disclosure also provides a method for manufacturing a transistor array. The transistor array contains transistor elements which are two-terminal devices. Piezoelectric bodies with piezoelectric properties are provided between the top electrodes and bottom electrodes of (Continued)

the transistor array. The carrier transport progress of the transistor elements in the transistor array device can be effectively regulated or triggered by strains or stresses applied on the transistor elements.

20 Claims, 3 Drawing Sheets

(51) Int. Cl.
- H01L 41/113 (2006.01)
- H01L 41/047 (2006.01)
- H01L 41/053 (2006.01)
- H01L 41/187 (2006.01)
- H01L 41/193 (2006.01)
- H01L 41/29 (2013.01)
- H01L 29/78 (2006.01)
- G01L 1/16 (2006.01)
- H01L 41/22 (2013.01)
- H01L 41/317 (2013.01)

(52) U.S. Cl.
CPC ...... *H01L 41/0477* (2013.01); *H01L 41/0533* (2013.01); *H01L 41/1132* (2013.01); *H01L 41/187* (2013.01); *H01L 41/1876* (2013.01); *H01L 41/193* (2013.01); *H01L 41/22* (2013.01); *H01L 41/29* (2013.01); *H01L 41/317* (2013.01)

(56) References Cited

U.S. PATENT DOCUMENTS

| | | | | |
|---|---|---|---|---|
| 6,970,239 | B2* | 11/2005 | Chan | C12Q 1/6825 356/301 |
| 7,008,749 | B2* | 3/2006 | Gonsalves | B82Y 30/00 430/270.1 |
| 8,443,647 | B1* | 5/2013 | Kolmakov | G01N 27/127 324/601 |
| 2005/0194866 | A1* | 9/2005 | Scott | G06K 9/0002 310/344 |
| 2007/0188442 | A1* | 8/2007 | Hattori | G02F 1/167 345/107 |
| 2009/0179523 | A1* | 7/2009 | Wang | B82Y 10/00 310/338 |
| 2010/0253184 | A1* | 10/2010 | Choi | H02N 2/18 310/339 |
| 2011/0121591 | A1* | 5/2011 | Nishiwaki | B66C 1/445 294/86.4 |

OTHER PUBLICATIONS

Piezoelectric Field Effect Transistor and Nanoforce Sensor Based on a Single ZnO Nanowire Xudong Wang, Jun Zhou, Jinhui Song, Jin Liu, Ningsheng Xu, and Zhong L. Wang, Nano Letters 2006 6 (12), 2768-2772 (Year: 2006).*
C. G. Morris (Ed.), Academic Press Dictionary of Science & Technology (4th ed.). Oxford, UK: (1992). Retrieved from https://search.credoreference.com/content/entry/apdst/transistor/0?institutionId=743 (Year: 1992).*

* cited by examiner

TRANSISTOR ARRAY AND MANUFACTURING METHOD THEREOF

CROSS REFERENCE TO RELATED APPLICATIONS

This application is the National Stage of International Application No. PCT/CN2013/089184, filed on Dec. 12, 2013, which claims the benefit of Chinese Application No. 201310011220.X, filed on Jan. 11, 2013. The contents of both applications are hereby incorporated by reference in their entirety.

TECHNICAL FIELD

The disclosure relates to a semiconductor device, and more specifically, to a transistor array used for pressure-sensing imaging and a manufacturing method thereof.

BACKGROUND

Large-scale integration of miniscule functional components on a flexible and transparent substrate can lead to novel applications in fields of sensors, energy harvesting, human-computer interfacing and the like. Currently, one of the research focuses in the field of flexible electronics based pressure-sensing is to minimize the effects of bending deformation of piezoelectric material on the performance of the manufactured micro-nano pressure sensor. Most of the existing pressure-sensing technologies are based on planar field-effect-transistors (FETs). Although these technologies are quite mature, it generally requires complicated integration processes due to the three-terminal structure of the FET element. Furthermore, the pressure-sensing device of a transistor array based on such technology lacks a direct interfacing mechanism between external environment and the electronic devices.

In addition, the integration density of the existing flexible pressure sensors based on planar FETs is limited by the size of each element, which generally can be hundreds of microns per element, thus significantly affecting the integration density and spatial resolution of the pressure sensors.

SUMMARY

An object of the disclosure is to provide a transistor array whose electrical performance may be directly regulated by external mechanical actions.

To achieve the object, the present disclosure provides a transistor array including a substrate and a plurality of transistor elements sharing the substrate. Each of the transistor elements includes:

a bottom electrode disposed on the substrate and a connection wire for the bottom electrode;

a piezoelectric body disposed on the bottom electrode, wherein the piezoelectric body is made of piezoelectric material; and a top electrode disposed on the piezoelectric body.

In one embodiment, the piezoelectric body of each transistor element has a polarized orientation.

In one embodiment, the polarized orientation of the piezoelectric body of each transistor element is substantially perpendicular to the surface of the substrate.

In one embodiment, the polarized orientations of the piezoelectric bodies of the transistor elements in the transistor array are substantially the same.

In one embodiment, there further includes a flexible insulation layer between the transistor elements in the transistor array, wherein at least the top electrodes of the transistor elements are exposed on the upper surface of the flexible insulation layer.

In one embodiment, each transistor element further comprises a connection wire for the top electrode, and the connection wire is configured to draw the top electrode outside the transistor array.

In one embodiment, the transistor array further includes an encapsulation layer disposed on the flexible insulation layer and configured to encapsulate parts of the transistor elements which are exposed on the upper surface of the flexible insulation layer.

In one embodiment, the piezoelectric body of each transistor element is nanowire, nanorod or film made of ZnO, GaN, CdS, InN, InGaN, CdTe, CdSe, $ZnSnO_3$, or lead zirconate titanate, or nanofibers made of poly(vinylidene fluoride) (PVDV).

In one embodiment, the piezoelectric body of each transistor element is nanowire, nanorod or nanofiber, wherein an axial direction of the piezoelectric body is substantially perpendicular to the surface of the bottom electrode or the substrate.

In one embodiment, a cross section area of each transistor element is 25 $\mu m^2$ or less.

In one embodiment, a distance between the transistor elements ranges from several microns to several millimeters.

In one embodiment, the transistor elements are cylinders, quadrangular prisms, hexagonal prisms, or irregular poles whose axial directions are substantially perpendicular to the substrate.

In one embodiment, the piezoelectric bodies of the transistor elements are made of the same piezoelectric material.

In one embodiment, there includes multiple identical transistor elements.

In one embodiment, the substrate is a flexible or rigid substrate.

In one embodiment, the top electrode and/or the bottom electrode of each transistor element is made of one of conductive oxide, grapheme, or Ag nanowire coating, or one of Au, Ag, Pt, Al, Ni, Cu, Ti, Cr, Se or alloy thereof.

Correspondingly, the disclosure also provides a method for manufacturing a transistor array, including:

providing a substrate;

on the substrate, manufacturing, a bottom electrode array including a plurality of bottom electrodes, and connection wires for the bottom electrodes;

on the bottom electrodes, manufacturing piezoelectric bodies forming a piezoelectric body array; and on the piezoelectric bodies, manufacturing top electrodes forming a top electrode array.

In one embodiment, after manufacturing piezoelectric bodies on the bottom electrodes, the method further includes:

between the piezoelectric bodies, manufacturing a flexible insulation layer, wherein top parts of the piezoelectric bodies are exposed on the flexible insulation layer.

In one embodiment, manufacturing top electrodes on the piezoelectric bodies further includes:

on the piezoelectric bodies and the flexible insulation layer, manufacturing the top electrodes and connection wires for the top electrodes, wherein the top electrodes are located on the piezoelectric bodies, and the connection wires for the top electrodes are electrically connected to the top electrodes.

Compared with the prior art, the disclosure may have the following advantages.

The disclosure provides a transistor array including a substrate and a plurality of transistor elements sharing the substrate. Each of the transistor elements includes a bottom electrode disposed on the substrate and a connection wire for the bottom electrode; a piezoelectric body disposed on the bottom electrode, wherein the piezoelectric body is made of piezoelectric material; and a top electrode disposed on the piezoelectric body. The piezoelectric sensing transistor array according to the disclosure differs from the piezoelectric sensing transistor array in the prior art in that the transistor elements of the transistor array according to the disclosure are two-terminal devices, wherein the transport properties between the top electrodes and the bottom electrodes of the transistor elements can be regulated by external stresses or strains, rather than a gate voltage of the FET. When the transistor elements deform under the stresses, strains or pressures applied on the transistor array, the piezoelectric bodies made of piezoelectric material will deform correspondingly, and will in turn produce a positive piezoelectric potential at one end (the bottom) and a negative piezoelectric potential at the other end (the top) within the piezoelectric bodies. The produced piezoelectric potentials can effectively regulate the interface barrier between the piezoelectric bodies and the electrode material around the bottom electrodes (source) or the top electrodes (drain) in the transistor elements, and acts similarly as the gate voltage applied at the gate in FET. The carrier transport progress in the device can be effectively regulated or triggered by the stresses or strains applied on the transistor elements. When the stresses and strains applied on the different transistor elements are different, the deformations of the piezoelectric bodies are also different. Therefore, the transport properties of the corresponding transistor elements are different. By recording the changes of the transport properties of the different transistors, the strength and the spatial distribution of the stresses or strains can be recorded.

The mechanical drives for producing piezoelectric potentials in the piezoelectric bodies of the transistor array may be mechanical vibration signals produced by air or water flow, rotation of a machine engine in operation, motion of human body, stretch of muscles, breath, heart beats, blood flow, or the like. Therefore, the transistor array according to the disclosure can be used as a pressure-sensing device in various fields.

The transistor elements in the transistor array according to the disclosure may have simple structures and may be accessed individually. The cross section area of each transistor element may be as small as 25 $\mu m^2$ or less, and the distance between the transistor elements may be 50 $\mu m$ or less. As a pressure-sensing imaging device, the spatial resolution thereof is much higher than that of an FET array in the prior art. Furthermore, the piezoelectric body of each transistor element may use nanowires, nanorods, films or nanofibers, and is thus sensitive to pressures. Therefore, the pressure resolution can be 1 kilopascal or less.

BRIEF DESCRIPTION OF THE DRAWINGS

With reference to the drawings, the above and other objects, features and advantages will be more apparent, in which the same or similar reference signs refer to the same or similar elements. The drawings are not necessarily drawn to scale, in which certain features may be exaggerated or omitted in order to illustrate and explain the disclosure more clearly.

DETAILED DESCRIPTION

In the following description, various embodiments of the disclosure will be described in detail with reference to the drawings. It is of course that the described embodiments are only intended to illustrate the teachings of the present disclosure, rather than to represent all the embodiments. Other embodiments without any other inventive effort from the described ones should be included in the scope of the present disclosure.

Meanwhile, the disclosure is described in detail with reference to the drawings, in which the illustrated drawings are only schematic, and should not be construed to limit the scope of the disclosure.

Most of the existing pressure-sensing technologies are based on planar field-effect-transistors (FETs). Due to the three-terminal structure of the FET element, the FET element generally requires complicated integration processes. Furthermore, the pressure-sensing device of a transistor array based on such technology lacks a direct interfacing mechanism between external environment and the electronic devices. In addition, the integration density of the existing flexible pressure sensors based on planar FETs is limited by the size of each element, which generally can be hundreds of microns per element, thus significantly affecting the integration density and spatial resolution of the pressure sensors. To overcome the defects of the prior art, the disclosure provides a transistor array including a plurality of independently-functioning transistor elements sharing a substrate, wherein the structure of the transistor elements can be of a metal-piezoelectric body-metal structure. The disclosure uses vertically grown or disposed piezoelectric bodies (nano piezoelectric bodies) to manufacture a three-dimensional (3D) large scale piezoelectric transistor array and to effectively regulate the carrier transport of the manufactured piezoelectric transistors via piezoelectric potentials produced by stresses on the piezoelectric bodies. Thus, the on-off states of the transistors can be regulated by using the piezoelectric potential as a gate signal, and a novel method for driving and controlling the electrical devices, micro-nano electromechanical devices and sensors by stresses, strains or pressures can be obtained.

The present disclosure will be more apparent by describing the embodiments of the present disclosure with reference to the accompanying drawings.

First Embodiment

Figure 1:
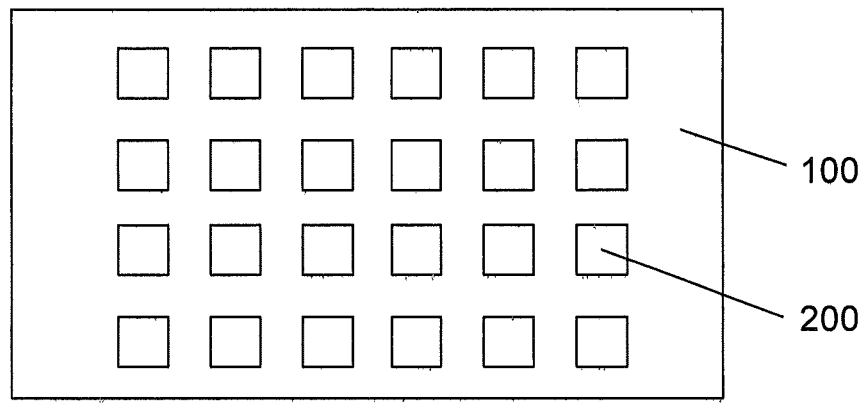
FIG. 1 is a top view illustrating a transistor array according to a first embodiment of the disclosure.
Figure 2:
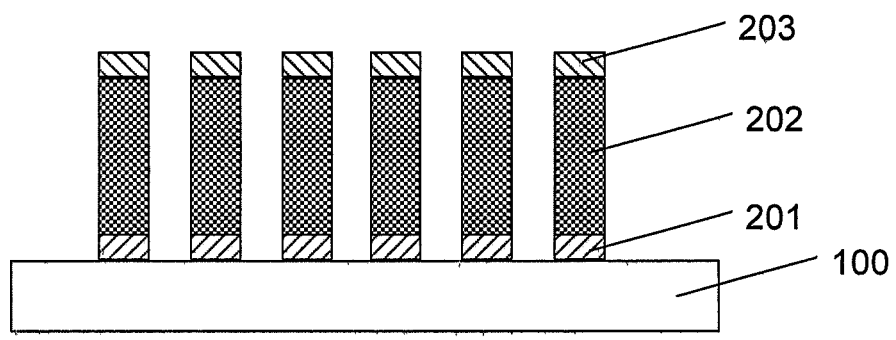
FIG. 2 is a cross-sectional view illustrating the transistor array according to the first embodiment of the disclosure.

The transistor array according to the embodiment is shown in FIGS. 1 and 2. FIG. 1 is a top view illustrating the transistor array, and FIG. 2 is a cross-sectional view illustrating the transistor array, which includes a substrate 100 and a plurality of transistor elements 200 (including m×n transistor elements, m and n are any natural number no less than 1) sharing the substrate 100. Each of the transistor elements includes: a bottom electrode 201 and a connection wire for the bottom electrode (not shown), disposed on the substrate 100; a piezoelectric body 202 disposed on the bottom electrode 201; and a top electrode 203 disposed on the piezoelectric body 202. The piezoelectric body 202 is made of piezoelectric material, and can be selected among nanowires, nanorods or films made of ZnO, GaN, CdS, InN, InGaN, CdTe, CdSe or $ZnSnO_3$ or lead zirconate titanate (PZT), or nanofibers made of poly(vinylidene fluoride) (PVDF). In one embodiment, the piezoelectric bodies of the transistor elements are made of the same piezoelectric material, i.e., all of the piezoelectric bodies of the transistor elements are made of the same piezoelectric material. In one embodiment, the piezoelectric bodies are piezoelectric nanowires, nanorods or nanofibers. In one embodiment, the orientations of piezoelectric bodies are arranged with respect to the bottom electrodes or the substrate, such that the axial directions of the piezoelectric bodies are substantially perpendicular to the bottom electrodes or the substrate.

For the piezoelectric bodies in the transistor array, in one embodiment, the piezoelectric bodies may have a polarized orientation. A monocrystalline material can be obtained by a growth technology, or a polycrystalline material can be obtained by a deposition technology. The existing manufacturing methods can obtain materials with a common polarized orientation, for example, c-axis orientated ZnO nanowires can be obtained by vapor deposition or liquid phase deposition technology as piezoelectric bodies. Since the c-axis is the polarized orientation of ZnO, when the transistor array is applied with a strain or stress, the piezoelectric bodies (ZnO) of the transistor elements will deform correspondingly, and will in turn produce a positive piezoelectric potential at one end and a negative piezoelectric potential at the other end along the c-axis direction in ZnO.

In one embodiment, in the transistor array according to the disclosure, the piezoelectric bodies in the transistor array may have a polarized orientation substantially perpendicular to the surface of the substrate. For example, in the transistor array, the piezoelectric bodies of the transistor elements are ZnO nanowires whose polarized orientation is along the c-axis, and the c-axis of the ZnO nanowires is perpendicular to the substrate. In one embodiment, in the transistor array, the polarization orientations of the piezoelectric bodies of the transistor elements are substantially the same. Such structure results in that the polarization orientations of the piezoelectric bodies of transistor elements are the same or similar with one another. If the transistor elements are of the same material, then their response performances to external stresses or strains are also similar, and the performances of the transistor elements will be substantially the same.

In one embodiment, the substrate 100 may be a flexible or rigid substrate. It can be made of a flexible material such as polyimide, polyethylene terephthalate (PET) or the like, or an inflexible (rigid) material such as silicon, ceramics or the like.

The bottom electrodes 201 and connection wires for the bottom electrodes in the transistor elements 200 can be made of one of conductive oxide, graphene, and Ag nanowire coating, or one of Au, Ag, Pt, Al, Ni, Cu, Ti, Cr, Se or alloy thereof. The material of the connection wires for the bottom electrodes may be the same as the material of the bottom electrodes. The connection wires for the bottom electrodes are used to draw the bottom electrodes outside the transistor array and to connect the bottom electrodes of the transistor array and external circuits, such as a power supply for the transistor array, a measurement device and the like. The top electrodes 203 may also be made of one of conductive oxide, graphene, and Ag nanowire coating, or one of Au, Ag, Pt, Al, Ni, Cu, Ti, Cr, Se or alloy thereof. The materials of the top electrodes 203 and the bottom electrodes 201 may or may not be the same. In practice, a common method for drawing an electrical path is used to draw the bottom electrodes and top electrodes outside the transistor array, and then external circuits are connected between the bottom electrode and top electrode of each transistor element.

The shape of the transistor elements 200 shown in FIG. 1 is not limited to a quadrangular prism whose axial direction is perpendicular to the substrate surface. The shape of the transistor elements 200 can also be a cylinder, a hexagonal prism, or an irregular pole whose axial direction is perpendicular to the substrate surface. In the transistor array, the cross section area of each transistor element may be 25 $\mu m^2$ or less, and the distance between the transistor elements may be 50 μm or less.

In one embodiment, the each transistor element in the transistor array may have the same size, shape and material.

A field-effect-transistor includes a source, a drain and a gate, wherein the channel width between the source and the drain is controlled by the gate voltage applied at the gate. In a 3D vertical nanowires piezoelectric transistor array structure, it is not necessary to manufacture a ring shaped gate, which is very difficult to implement in manufacturing techniques.

The piezoelectric transistor array of the present disclosure differs from the prior art piezoelectric transistor array in that the transistor elements of the transistor array of the disclosure are two-terminal devices, wherein the transport properties between the top electrodes and the bottom electrodes may be regulated by external stresses or strains, rather than a gate voltage, which means that the gate voltage applied at the third terminal of the transistor in the prior art is replaced by the external stresses or strains. When the transistor elements deforms under the stresses, strains or pressures applied on the transistor array, the piezoelectric bodies made of piezoelectric material will deform correspondingly, and will in turn produce a positive piezoelectric potential at one end and a negative piezoelectric potential at the other end within the piezoelectric bodies. The mechanical drives for producing piezoelectric potentials within the piezoelectric bodies may be mechanical vibration signals produced by air or water flow, rotation of a machine engine in operation, motion of human body, stretch of muscles, breath, heart beats, blood flow, or the like. The produced piezoelectric potentials can effectively regulate the interface barrier between the piezoelectric bodies and the electrode material around the bottom electrodes (source) or the top electrodes (drain) in the transistor elements, and acts similarly as the gate voltage applied at the FET gate. The carrier transport progress in the device can be effectively regulated or triggered by the stresses or strains applied on the transistor elements. When the stresses and strains applied on the different transistor elements are different, the deformations of the piezoelectric bodies are also different. Therefore, the transport properties of the corresponding transistor elements are different. By recording the transport properties of the different transistor elements, the strength and the spatial distribution of the stresses or strains can be recorded.

In one embodiment, the transistor array is formed by two-terminal transistor elements, wherein the transistor elements are piezoelectric transistors perpendicular to the substrate. This structure, i.e., the 3D vertical piezoelectric transistor array structure, may not only achieve a direct interfacing between electronic devices and mechanical pressures, but also avoids the manufacture of a ring-shaped gate which is difficult to implement in the traditional 3D vertical nanowires piezoelectric transistor.

Since each transistor element has an individual top electrode and an individual bottom electrode, it can be individually accessed by peripheral circuits. In the embodiment, the cross section area of each transistor element in parallel with the substrate surface can be as small as 25 µm² or less, and the distance between the transistor elements can be 50 µm or less. As a pressure-sensing imaging device, the spatial resolution thereof is much higher than that of an FET array in the prior art. In addition, the piezoelectric body of each transistor element may use nanowires, nanorods, films or nanofibers, and is thus sensitive to pressures. Therefore, the pressure resolution of the transistor elements can be 1 kilopascal or less.

Second Embodiment

Figure 3:
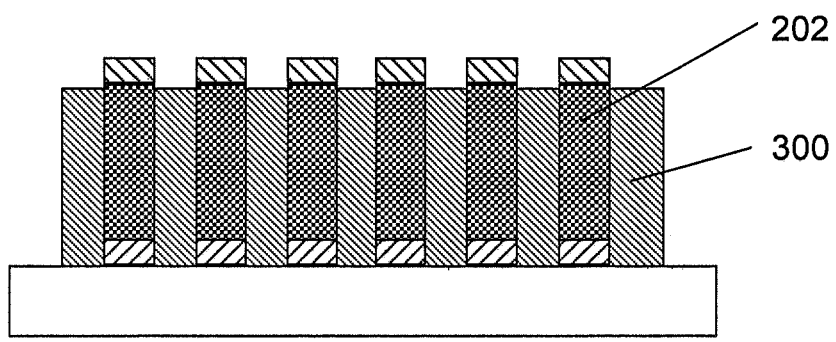
FIG. 3 and FIG. 4 are schematic diagrams illustrating a transistor array according to a second embodiment of the disclosure.

With reference to FIG. 3, the second embodiment differs from the first embodiment in that a flexible insulation layer 300 is infused between the transistor elements 20Q. The height of the flexible insulation layer 300 may be slightly lower than the piezoelectric bodies 202 of the transistor elements. At least the top electrodes 203 of the transistor elements 200 are exposed on the top of the flexible insulation layer 300. As shown in FIG. 3, other components of the transistor array according to the second embodiment are the same as that in the first embodiment, which will not be discussed in detail.

The material of the flexible insulation layer may be polydimethylsiloxane (PDMS), SU-8 epoxy resin or any other flexible insulation material. The flexible insulation layer may enhance the mechanical strength of the transistor array device and prolong the lifetime of the device.

Figure 4:
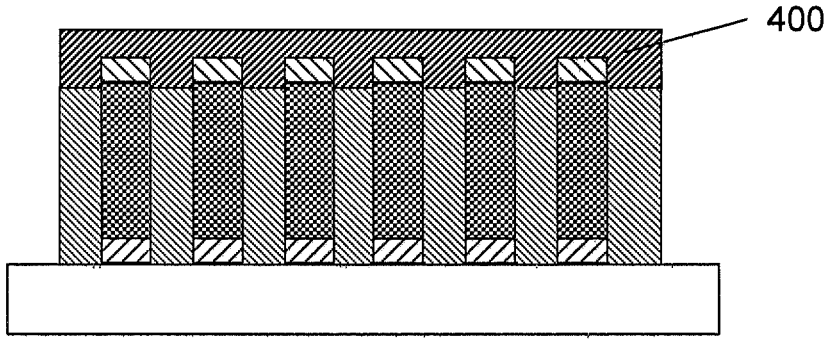

Additionally, in order to protect the mechanical structure of the transistor array, the transistor array in the embodiment may further include an encapsulation layer which may encapsulate the top electrodes of the transistor array. As shown in FIG. 4, the connection wires for the top electrodes electrically connected with the top electrodes of the transistor array (i.e., electrical path, not shown) are drawn outside the transistor array, and then are encapsulated on the top of the transistor array with the encapsulation layer 400. The encapsulation layer 400 is disposed on the flexible insulation layer 300. In the transistor array, parts of transistor elements, exposed on the flexible insulation layer 300, are encapsulated in the encapsulation layer 400. The previously discussed parts of transistor elements exposed on the top of the flexible insulation layer include at least the top electrodes 203 of the transistor elements, the connection wires for the top electrodes (not shown), and the top parts of the piezoelectric bodies which are not covered by the flexible insulation layer material. In this case, the transistor elements are entirely encapsulated within the flexible insulation layer 300 and the encapsulation layer 400. The material of the encapsulation layer may be common encapsulation semiconductor material, such as polydimethylsiloxane (PDMS) and the like. The encapsulation layer may enhance the mechanical strength of the transistor array device and avoid the effects of the environment conditions (such as humanity) on the transistor array device.

In the present embodiment, the connection wires for the top electrodes may also be made of one of conductive oxide, graphene, and Ag nanowire coating, or one of Au, Ag, Pt, Al, Ni, Cu, Ti, Cr, Se or alloy thereof. The material for the top electrodes 203 and the material for the connection wires for the top electrodes may or may not be the same. The connection wires for the top electrode and the bottom electrode of each transistor element can be used to connect external circuits of the corresponding transistor element.

In the transistor array according to the embodiment, the conductive oxide used for the top electrodes, the connection wires for the top electrode, the bottom electrode and the connection wires for the bottom electrode of the transistor elements may be one or more of Indium Tin Oxide (ITO), Aluminum doped Zinc oxide (AZO), Gallium doped Zinc Oxide (GZO), Indium and Gallium Doped Zinc Oxide (IGZO), and other conductive oxide materials.

Third Embodiment

Figure 5:
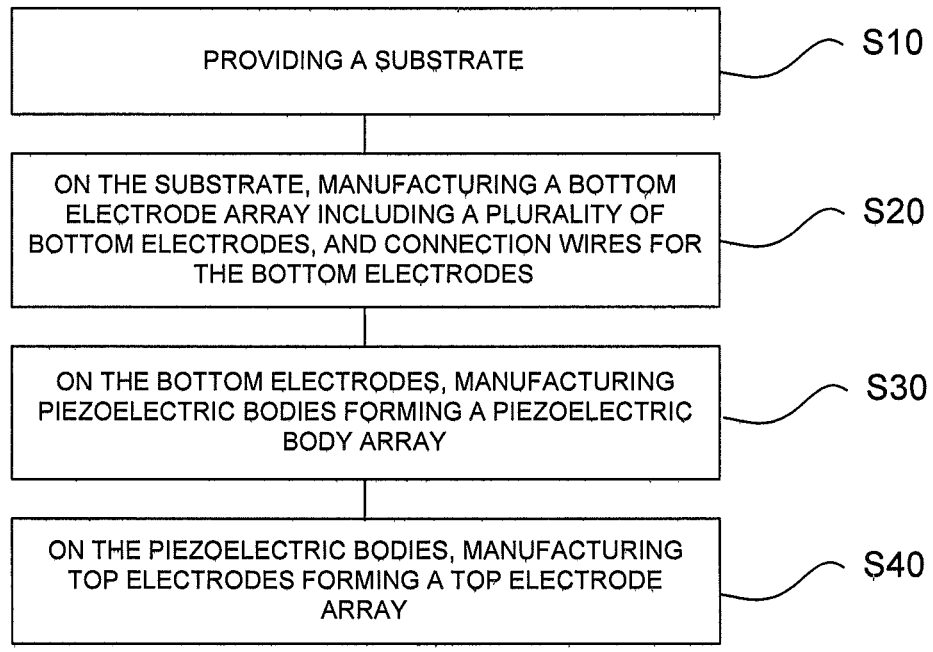
FIG. 5 is a flow chart illustrating a method for manufacturing a transistor array according to the disclosure.

The present embodiment provides a method for manufacturing a transistor array. FIG. 5 is a flow chart illustrating a method for manufacturing a transistor array, including:
  step S10, providing a substrate;
  step S20, on the substrate, manufacturing, a bottom electrode array including a plurality of bottom electrodes, and connection wires for the bottom electrodes;
  step S30, on the bottom electrodes, manufacturing piezoelectric bodies forming a piezoelectric body array; and
  step S40, on the piezoelectric bodies, manufacturing top electrodes forming a top electrode array.

In the following, the procedure for manufacturing a transistor array is described in detail with reference to the figures. The procedure includes the following steps.

Firstly, a substrate is provided. The substrate material may be a flexible material (such as polyimide, Polyethylene terephthalate (PET), or the like) or an inflexible (rigid) material (such as silicon, ceramics, or the like).

Figure 6:
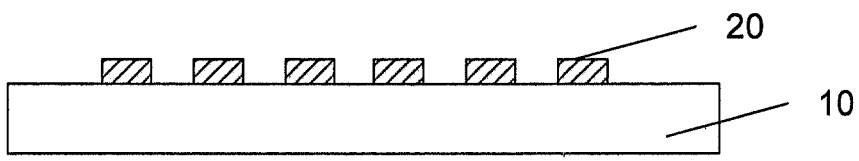
FIGS. 6-10 are schematic diagrams illustrating a procedure for manufacturing a transistor array according the disclosure.

On the substrate, a bottom electrode array including a plurality of the bottom electrodes and connection wires for each bottom electrode are manufactured. As shown in FIG. 6, by using lithography and metal deposition technologies of semiconductor processes on substrate 10, the bottom electrode array 20 and the connection wires for the bottom electrodes (not shown) are selectively deposited on the substrate according to a design pattern. In the bottom electrode array, the size and shape of each bottom electrode and the distance between the bottom electrodes are determined by the design requirement of the transistor array. The wiring of the connection wires for the bottom electrodes may be the wiring used for integrated circuits (ICs), which are not specified herein. The connection wires for the bottom electrodes are used to draw the bottom electrodes of the transistor elements outside the transistor array, and to connect the bottom electrodes with external circuits, such as other drive or measurement devices.

Figure 7:
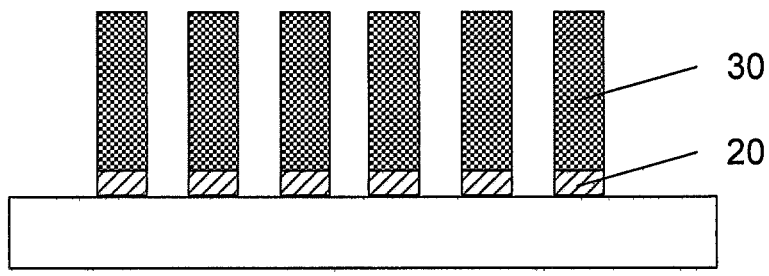

Piezoelectric bodies are manufactured on the substrate, and a piezoelectric body array is formed by the plurality of piezoelectric bodies. As shown in FIG. 7, by using photo mask and metal deposition technologies of the semiconductor process, seed crystal materials are selectively deposited on the manufactured bottom electrodes according to a design pattern. For example, if the piezoelectric bodies are made of ZnO nanowires, the seed crystal materials may also be made of ZnO nanowires. Then, by using a vapor deposition technology or a liquid phase deposition technology, piezoelectric materials with a common polarized orientation are vertically grown on the previous bottom electrodes 20 deposited with a seed crystal layer, and the piezoelectric bodies 30 are formed. Therefore, the piezoelectric body array is formed by the plurality of piezoelectric bodies 30. For example, by using a conventional hydrothermal synthesis method, piezoelectric bodies with ZnO nanowires which are orientated in c-axis are grown on the ZnO seed crystal layer on the bottom electrodes 20. The diameter of the piezoelectric bodies may range from hundreds of nanometers to several microns, and the length thereof may range from hundreds of nanometers to tens of microns. Each individual piezoelectric body may include one or more nanowires or nanorods.

The step of manufacturing piezoelectric bodies 30 on the bottom electrodes 20 may also use micro-manufacturing technologies, and a preprocessed nanomaterial is disposed on the bottom electrodes.

Figure 8:
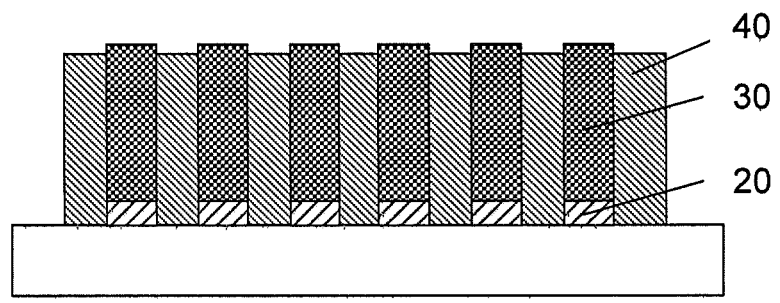

In order to enhance the mechanical strength of the transistor array and prolong the lifetime of the device, the method further includes: after manufacturing the piezoelectric bodies on the bottom electrodes, manufacturing a flexible insulation layer between the piezoelectric bodies, wherein the top parts of the piezoelectric bodies are exposed on the flexible insulation layer. As shown in FIG. 8, by using the spin coating technology in the semiconductor manufacturing process, a layer of infusion material with appropriate thickness can be uniformly spun on the previously manufactured device, such that at least the bottom electrodes 20 and the piezoelectric bodies 30 are covered with the infusion material. In one embodiment, the infusion material is a flexible insulation material, such as polydimethylsiloxane (PDMS), SU-8 epoxy resin, or the like. The infusion material is, for example, heated or exposed, such that the mechanical strength of material meets the requirement. After the top part of the infusion material with an appropriate height is uniformly removed using the plasma dry etch technology, the top parts of the previously manufactured piezoelectric bodies 30 with an appropriate height are exposed. Hence, the remaining infusion material may form a flexible insulation layer 40.

Figure 9:
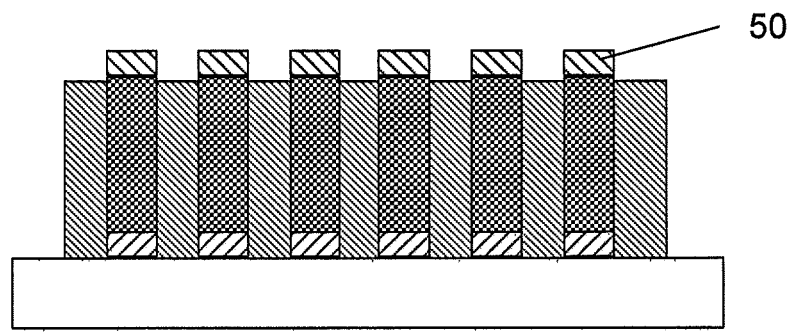

The top electrodes are manufactured on the piezoelectric bodies and a plurality of the top electrodes forms a top electrode array. In this step, the connection wires for the top electrodes may be manufactured to draw the top electrodes outside the transistor array, while the top electrodes are being manufactured. With reference to FIG. 9, by using the photo mask and metal deposition technologies of the semiconductor processes, the top electrode array 50 and the connection wires for the top electrodes (not shown) are selectively deposited on the top part of the previously manufactured piezoelectric array and the flexible insulation layer according to a design pattern, such that the top electrodes are manufactured on the piezoelectric bodies and the connection wires for the top electrodes are manufactured on the flexible insulation layer. The top electrodes are electrically in contact with the top parts of the piezoelectric bodies made of the piezoelectric material. A top electrode array is formed by a plurality of the top electrodes 50. Therefore, the manufacture of the transistor array ends.

Alternatively, the step of manufacturing the connection wires for the top electrodes can be separately performed after the manufacture of the top electrodes.

Figure 10:
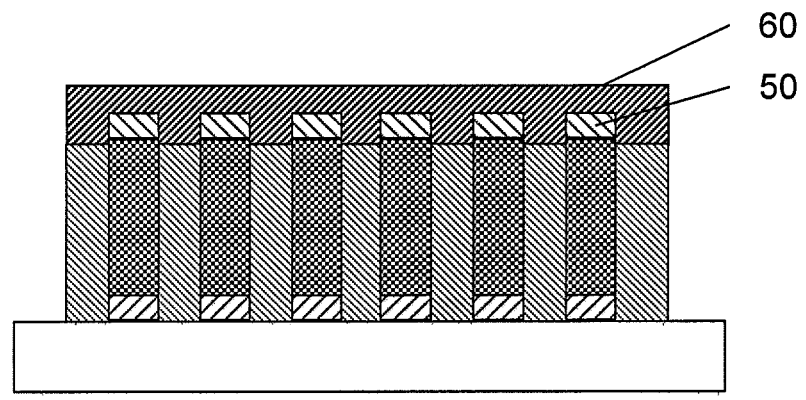

In order to enhance the mechanical strength of the transistor array, the previously manufactured transistor array device can be covered with a encapsulation layer 60 made of, for example, polydimethylsiloxane (PDMA), which can encapsulate the exposed parts of transistor elements on the flexible insulation layer. As shown in FIG. 10, the top electrodes of the transistor elements 50, the connection wires for the top electrodes and the exposed parts of the piezoelectric bodies 30 on the flexible insulation layer 40 are encapsulated within the encapsulation layer 60.

When a power supply between the connection wires for the top electrode and the connection wires for the bottom electrode of the transistor array elements in the previously manufactured transistor array is turned on, the electrical properties of each transistor element in the transistor array device can be tested by a multi-channel electrical measurement system. When the mechanical signals (such as mechanical vibration signals produced by air or water flow, rotation of a machine engine in operation, motion of human body, stretch of muscles, breath, heart beats, blood flow, or the like) are applied on the transistor array device, the electrical properties of the piezoelectric body in each transistor element which is affected by a mechanical strain will change, due to the occurring of the piezoelectric potential induced by the mechanical strain. The multi-channel electrical measurement system will record the change. By associating the collected values of electrical parameters with the corresponding transistor element, and by using software (such as Matlab) for graphic process, the sensing and imaging information of the mechanical signals from the external environment (such as stress) can be obtained.

The above are only preferred embodiments of the disclosure, and are not intended to limit the disclosure in any aspects. Those skilled in the art can make many changes and modifications to the present disclosure, or modify one of the discussed embodiments to an equivalent embodiment, by using the disclosed method and teachings, without departing from the scope of the disclosure. Therefore, those changes, equivalences and modifications on the embodiments according to the disclosed teachings of the present disclosure still fall in the scopes of the disclosure, without departing from the scopes of the disclosure.

The invention claimed is:

1. A piezoelectric array comprising a substrate and a plurality of piezoelectric elements sharing the substrate, each of the piezoelectric elements including:
    an individual bottom electrode formed of a first material disposed on the substrate and a connection wire for the bottom electrode;
    a piezoelectric body disposed on the bottom electrode, wherein the piezoelectric body is made of piezoelectric material; and
    an individual top electrode formed of a second material disposed on the piezoelectric body,
wherein the piezoelectric body of each piezoelectric element is configured to deform when the respective piezoelectric element deforms under stresses, strains, or pressures applied to the piezoelectric array, thereby producing a positive piezoelectric potential at one end and a negative piezoelectric potential at the other end within the piezoelectric body, and the produced piezoelectric potentials regulate or trigger carrier transport progress of the piezoelectric elements, wherein a diameter of the piezoelectric body of each piezoelectric element ranges from hundreds of nanometers to several microns, and each piezoelectric body includes one or more nanowires or nanorods.

2. The piezoelectric array of claim 1, wherein the piezoelectric body of each piezoelectric element has a polarized orientation.

3. The piezoelectric array of claim 2, wherein the polarized orientation of the piezoelectric body of each piezoelectric element is substantially perpendicular to the surface of the substrate.

4. The piezoelectric array of claim 2, wherein the polarized orientations of the piezoelectric bodies of the piezoelectric elements in the piezoelectric array is substantially the same.

5. The piezoelectric array of claim 1, further comprising a flexible insulation layer between the piezoelectric elements, wherein at least the top electrodes of the piezoelectric elements are exposed on the upper surface of the flexible insulation layer.

6. The piezoelectric array of claim 5, wherein each of the piezoelectric elements further includes a connection wire for the top electrode, and wherein the connection wire is configured to connect the top electrode to an external element.

7. The piezoelectric array of claim 6, wherein the piezoelectric array further includes an encapsulation layer disposed on the flexible insulation layer and configured to encapsulate parts of the piezoelectric elements which are exposed on the upper surface of the flexible insulation layer.

8. The piezoelectric array of claim 1, wherein the piezoelectric body of each piezoelectric element includes a nanowire or a nanorod made of ZnO, GaN, CdS, InN, InGaN, CdTe, CdSe, $ZnSnO_3$, or lead zirconate titanate.

9. The piezoelectric array of claim 8, wherein an axial direction of the piezoelectric body is substantially perpendicular to the surface of the bottom electrode or the substrate.

10. The piezoelectric array of claim 1, wherein the cross-sectional area of each piezoelectric element is 25 $\mu m^2$ or less.

11. The piezoelectric array of claim 10, wherein the distance between two neighboring piezoelectric elements ranges from several microns to several millimeters.

12. The piezoelectric array of claim 1, wherein the piezoelectric elements are cylinders, quadrangular prisms, hexagonal prisms, or irregular poles whose axial directions are substantially perpendicular to the substrate.

13. The piezoelectric array of claim 1, wherein the piezoelectric bodies of the piezoelectric elements are made of the same piezoelectric material.

14. The piezoelectric array of claim 1, wherein the piezoelectric elements are identical.

15. The piezoelectric array of claim 1, wherein the top electrode and/or the bottom electrode of each piezoelectric element is made of a conductive oxide, graphene, or a Ag nanowire coating; or one of Au, Ag, Pt, Al, Ni, Cu, Ti, Cr, Se, or an alloy thereof.

16. A method for manufacturing a piezoelectric array, comprising:
providing a substrate;
manufacturing on the substrate a bottom electrode array including a plurality of bottom electrodes and connection wires for the bottom electrodes;
manufacturing on the bottom electrodes piezoelectric bodies, thereby forming a piezoelectric body array; and
manufacturing on the piezoelectric bodies top electrodes, thereby forming a top electrode array.

17. The method of claim 16, further comprising: after manufacturing piezoelectric bodies on the bottom electrodes, manufacturing a flexible insulation layer between the piezoelectric bodies, wherein the top parts of the piezoelectric bodies outside the flexible insulation layer are exposed.

18. The method of claim 17, further comprising: manufacturing connection wires for the top electrodes and electrically connecting the connection wires to the top electrodes.

19. The piezoelectric array of claim 4, further comprising a flexible insulation layer between the piezoelectric elements, wherein the top electrodes of the piezoelectric elements are exposed on the upper surface of the flexible insulation layer.

20. The piezoelectric array of claim 1, wherein the substrate is polyethylene teraphthalate and the piezoelectric body of each piezoelectric element includes a nanowire or a nanorod made of ZnO.

* * * * *